United States Patent
Han et al.

(10) Patent No.: US 10,325,810 B2
(45) Date of Patent: Jun. 18, 2019

(54) MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Liang Han, Shanghai (CN); Sheng Fen Chiu, Shanghai (CN); Liang Chen, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/862,100

(22) Filed: Jan. 4, 2018

(65) Prior Publication Data
US 2018/0197778 A1    Jul. 12, 2018

(30) Foreign Application Priority Data

Jan. 6, 2017 (CN) .......................... 2017 1 0011189

(51) Int. Cl.
*G11C 11/34* (2006.01)
*H01L 21/82* (2006.01)
*H01L 27/11519* (2017.01)
*H01L 21/28* (2006.01)
*H01L 29/423* (2006.01)

(52) U.S. Cl.
CPC ........ *H01L 21/82* (2013.01); *H01L 21/28273* (2013.01); *H01L 27/11519* (2013.01); *H01L 29/42324* (2013.01)

(58) Field of Classification Search
CPC ... G11C 16/102; G11C 16/24; G11C 16/0483; G11C 16/04; G11C 8/16; G11C 16/0416; G11C 16/3418; G11C 5/063
USPC ......... 365/185.17, 185.05, 185.18, 149, 174, 365/185.08, 185.25, 185.26, 185.28
See application file for complete search history.

(56) References Cited

U.S. PATENT DOCUMENTS

2012/0146125 A1* 6/2012 Kim .................. H01L 27/11524
257/321

* cited by examiner

*Primary Examiner* — Thong Q Le
(74) *Attorney, Agent, or Firm* — Anova Law Group, PLLC

(57) ABSTRACT

A memory and a method for fabricating the memory are provided. The method includes forming a plurality of first gate structures on a base substrate. Each first gate structure includes a floating gate structure and a control gate structure. The control gate structure includes a body region and a top region. A size of the top region is smaller than a size of the body region along a direction perpendicular to a length direction of the control gate structure. A sidewall of the top region is connected to a sidewall of the body region. The method also includes forming a dielectric layer on the base substrate and covering the plurality of first gate structures, while simultaneously forming air gaps in the dielectric layer between the adjacent first gate structures. A top of each air gap is above or coplanar with a top surface of the control gate structure.

20 Claims, 5 Drawing Sheets

MEMORY AND FABRICATION METHOD THEREOF

CROSS-REFERENCES TO RELATED APPLICATIONS

This application claims the priority of Chinese patent application No. 201710011189.8, filed on Jan. 6, 2017, the entirety of which is incorporated herein by reference.

FIELD OF THE DISCLOSURE

The present disclosure generally relates to the field of semiconductor manufacturing and, more particularly, relates to a memory and fabrication method thereof.

BACKGROUND

Flash memory is a type of long-term non-volatile storage medium that does not require power to retain data, and has advantages of high integration, fast access speed and easy to erase and rewrite, etc. Therefore, the flash memory has become the mainstream of non-volatile memory.

Depending on the structures, the flash memory can often be divided into two types: NOR flash memory and NAND flash memory. Compared to the NOR flash memory, the NAND flash memory can provide higher cell density, and can achieve higher storage density.

However, the electrical performance of the conventional NAND flash memory still needs to be improved. The disclosed device structures and methods are directed to solve one or more problems set forth above and other problems in the art.

BRIEF SUMMARY OF THE DISCLOSURE

One aspect of the present disclosure includes a method for fabricating a memory. The method includes forming a plurality of first gate structures on a base substrate. Each first gate structure includes a floating gate structure and a control gate structure on the floating gate structure. The control gate structure includes a body region and a top region above the body region. A size of the top region of the control gate structure is smaller than a size of the body region of the control gate structure along a direction perpendicular to a length direction of the control gate structure. A sidewall of the top region of the control gate structure is connected to a sidewall of the body region of the control gate structure. The method also includes forming a dielectric layer on the base substrate and covering the plurality of first gate structures, while simultaneously forming air gaps in the dielectric layer between the adjacent first gate structures. A top of each air gap is above or coplanar with a top surface of the control gate structure.

Another aspect of the present disclosure includes a memory. The memory includes a plurality of first gate structures on a base substrate. Each first gate structure includes a floating gate structure and a control gate structure on the floating gate structure. The control gate structure includes a body region and a top region above the body region. A size of the top region of the control gate structure is smaller than a size of the body region of the control gate structure along a direction perpendicular to a length direction of the control gate structure. A sidewall of the top region of the control gate structure is connected to a sidewall of the body region of the control gate structure. The memory also includes a dielectric layer on the base substrate and covering the plurality of first gate structures. The dielectric layer contains air gaps between the adjacent first gate structures, and a top of each air gap is above or coplanar with a top surface of the control gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
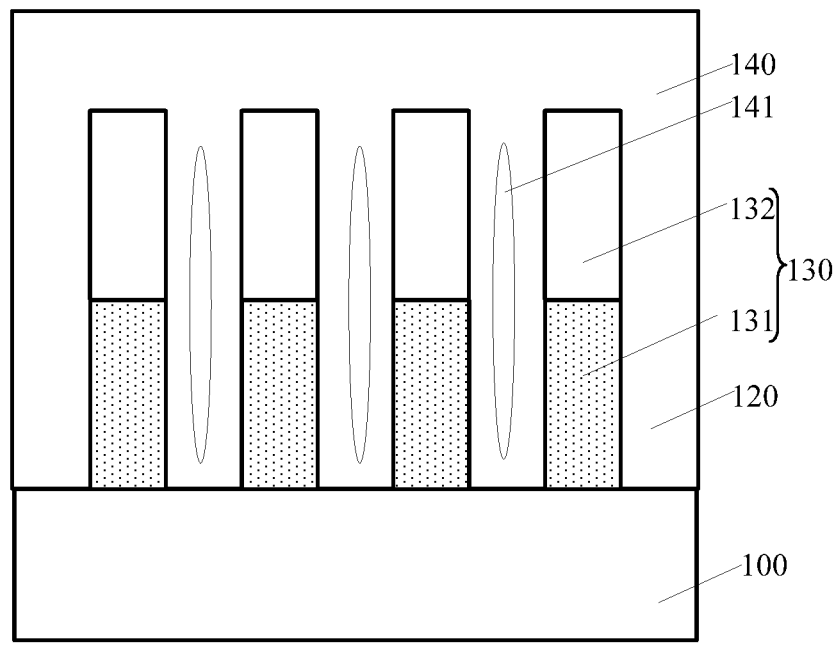
FIG. 1 illustrates a schematic diagram of a memory.

FIG. 1 illustrates a schematic diagram of a memory. Referring to FIG. 1, the memory includes a base substrate 100, and a plurality of gate structures 130 on the base substrate 100. Each gate structure 130 includes a floating gate structure 131 and a control gate structure 132 on the floating gate structure 131. The memory also includes a dielectric layer 140 on the base substrate 100 and covering the plurality of gate structures 130, and air gaps 141 in the dielectric layer 140 between the adjacent gate structures 130. The top edge of each air gap 141 is lower than the top surface of the control gate structure 132.

The air gap 141 is used to reduce capacitance between the adjacent gate structures 130, so as to reduce the probability of occurrence of programmed crosstalk between the adjacent gate structures 130.

When forming the dielectric layer 140, the growth of the dielectric layer 140 in a vertex region of the control gate structure 132 is affected by the joint action of the growth of the dielectric layer 140 on the top surface and sidewall surface of the control gate structure 132. Therefore, the growth rate of the dielectric layer 140 in the vertex region of the control gate structure 132 is larger than the growth rate of the dielectric layer 140 at other locations of the control gate structure 132. The growth of the dielectric layer 140 in the vertex region of the control gate structure 132 determines the position of the top of the air gap 141. Because a depth of each trench between the adjacent control gate structures 132 is large, during the growth of the dielectric layer 140, after the dielectric layers 140 in the vertex regions of the adjacent control gate structures 132 are joined together, the top edge of each air gap 141 is lower than the top surface of the control gate structure 132.

As feature dimensions of the memory continue to reduce, a distance between the adjacent gate structures 130 continues to decrease. As a result, the capacitance between the adjacent gate structures 130 increases, and the probability of occurrence of programmed crosstalk between the adjacent gate structures 130 increases. This greatly affects electrical performance of the memory.

Figure 6:
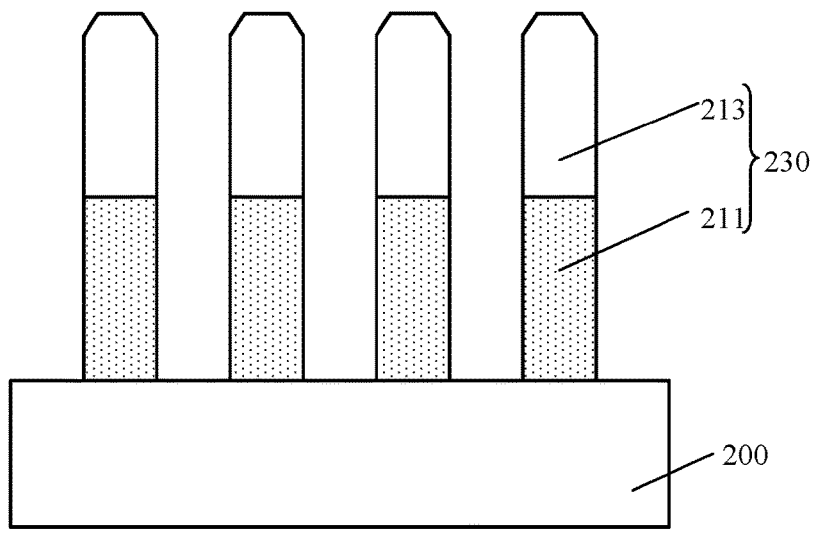
Figure 7:
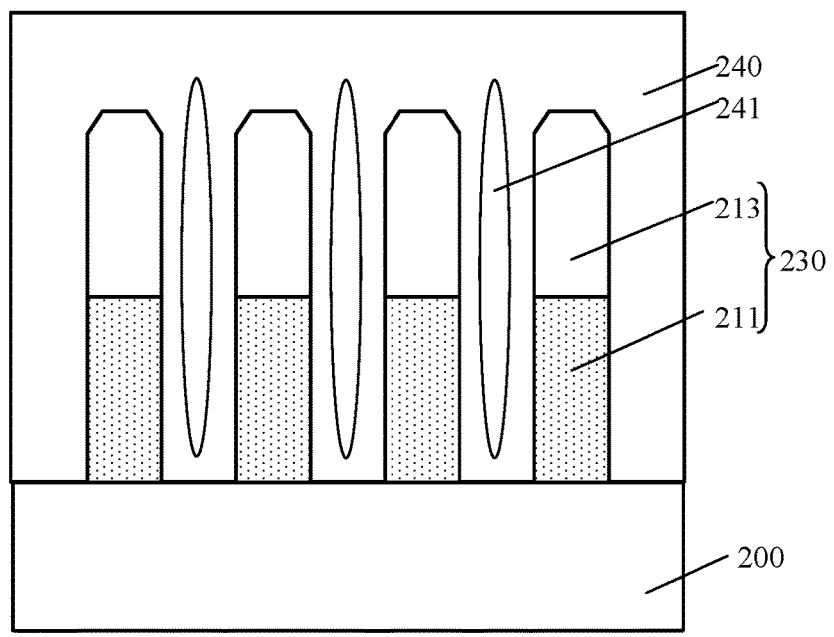
Figure 8:
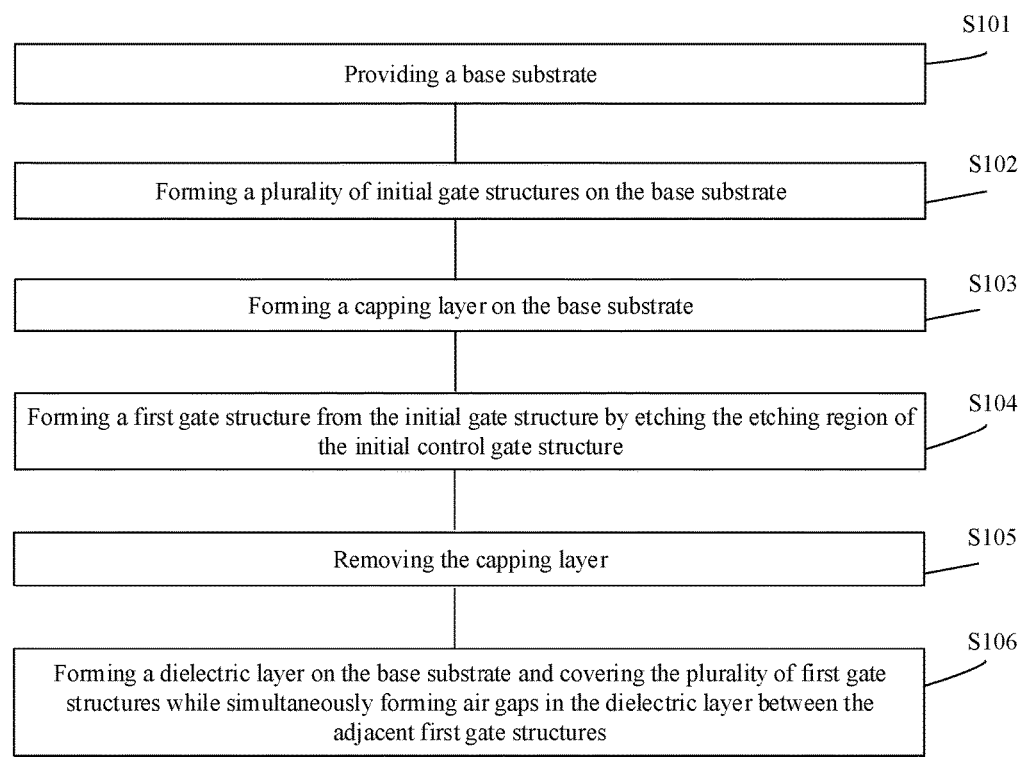
FIG. 8 illustrates an exemplary fabrication method for forming a memory consistent with various disclosed embodiments of the present disclosure.

The present disclosure provides a memory and fabrication method thereof. FIG. 8 illustrates an exemplary fabrication method for forming a memory consistent with various disclosed embodiments of the present disclosure; and FIGS. 2-7 illustrate semiconductor structures corresponding to certain stages of the exemplary fabrication method.

Figure 2:
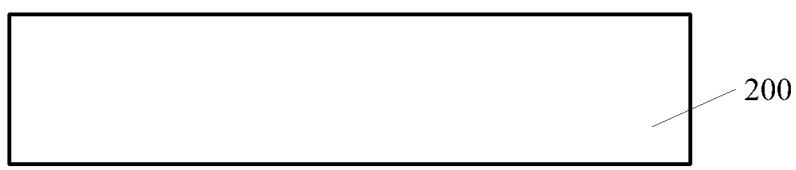
FIGS. 2-7 illustrate semiconductor structures corresponding to certain stages for forming an exemplary memory consistent with various disclosed embodiments of the present disclosure.

As shown in FIG. 8, at the beginning of the fabrication method, a base substrate may be provided (S101). FIG. 2 illustrates a corresponding semiconductor structure.

Referring to FIG. 2, a base substrate 200 may be provided. The base substrate 200 may provide a platform for forming the memory. In one embodiment, the base substrate 200 may be made of silicon, germanium, or silicon germanium, etc. In certain embodiments, the base substrate 200 may be made of silicon on insulator (SOI), germanium on insulator (GOI), or silicon germanium on insulator (SGOI), etc. In one embodiment, the base substrate 200 may be made of monocrystalline silicon.

Figure 3:
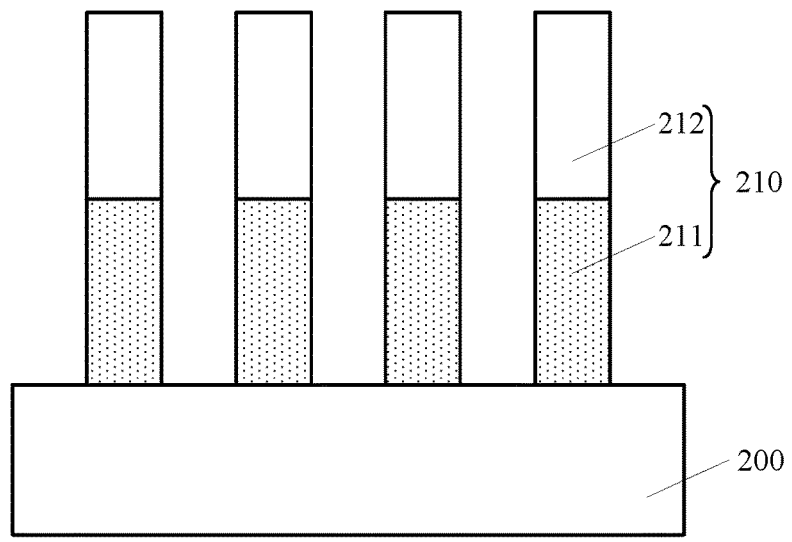

Returning to FIG. 8, after providing the base substrate, a plurality of initial gate structures may be formed (S102). FIG. 3 illustrates a corresponding semiconductor structure.

Referring to FIG. 3, a plurality of initial gate structures 210 may be formed on the base substrate 200. Each initial gate structure 210 may include a floating gate structure 211 and an initial control gate structure 212 on the floating gate structure 211. The initial control gate structure 212 may include an etching region at the top.

In one embodiment, the floating gate structure 211 may include a floating gate dielectric layer (not illustrated) on the base substrate 200 and a floating gate electrode layer (not illustrated) on the floating gate dielectric layer. The floating gate dielectric layer may be made of silicon oxide, or a high-K dielectric material (dielectric constant is greater than 3.9), etc. The floating gate electrode layer may be made of polysilicon.

The initial control gate structure 212 may include an initial control gate dielectric layer (not illustrated) on the floating gate structure 211 and an initial control gate electrode layer (not illustrated) on the initial control gate dielectric layer.

The initial control gate dielectric layer may be a single-layer structure, or a stacked structure. When the initial control gate dielectric layer is a single-layer structure, the initial control gate dielectric layer may be made of silicon oxide. When the initial control gate dielectric layer is a stacked structure, the initial control gate dielectric layer may include a first initial control gate dielectric layer, a second initial control gate dielectric layer on the first initial control gate dielectric layer, and a third initial control gate dielectric layer on the second initial control gate dielectric layer. The first initial control gate dielectric layer and the third initial control gate dielectric layer may be made of silicon oxide, and the second initial control gate dielectric layer may be made of silicon nitride.

The initial control gate dielectric layer may be used to form the control gate dielectric layer. The initial control gate electrode layer may be made of polysilicon. The initial control gate electrode layer may be used to form the control gate electrode layer.

In one embodiment, an isolation layer may also be formed when forming the initial gate structure 210. A method for forming the initial gate structure 210 and the isolation layer may include: forming an initial floating gate structure film on the base substrate 200; forming a first mask material layer on the initial floating gate structure film; patterning the first mask material layer, the initial floating gate structure film and portions of the base substrate 200 to form a floating gate structure film on the base substrate 200, a first mask layer on the floating gate structure film, and a trench between the adjacent floating gate structure films, between the adjacent first mask layers and in the base substrate 200; forming the isolation layer in the trench; removing the first mask layer; forming a control gate structure film on the base substrate 200, on the floating gate structure film and on the isolation layer; forming a patterned second mask layer on the control gate structure film, where an extension direction of the second mask layer may be perpendicular to an extension direction of the floating gate structure film; etching the control gate structure film and the floating gate structure film by using the second mask layer as a mask to form the floating gate structure 211 from the floating gate structure film and to form the initial control gate structure 212 from the control gate structure film, where the floating gate structure 211 and the initial control gate structure 212 may form the initial gate structure 210; and removing the second mask layer.

The isolation layer may be made of silicon oxide. In one embodiment, the top surface of the isolation layer may be above the top surface of the floating gate structure film. In another embodiment, the top surface of the isolation layer may be above the surface of the base substrate 200 and lower than the top surface of the floating gate structure film. In certain embodiments, the top surface of the isolation layer may be coplanar with the top surface of the floating gate structure film. In the disclosed embodiments, the top surface of the isolation layer may be above the top surface of the floating gate structure film.

Then, the etching region of the initial control gate structure 212 may be etched to form a control gate structure from the initial control gate structure 212, and to form a first gate structure from the initial gate structure 210.

Figure 4:
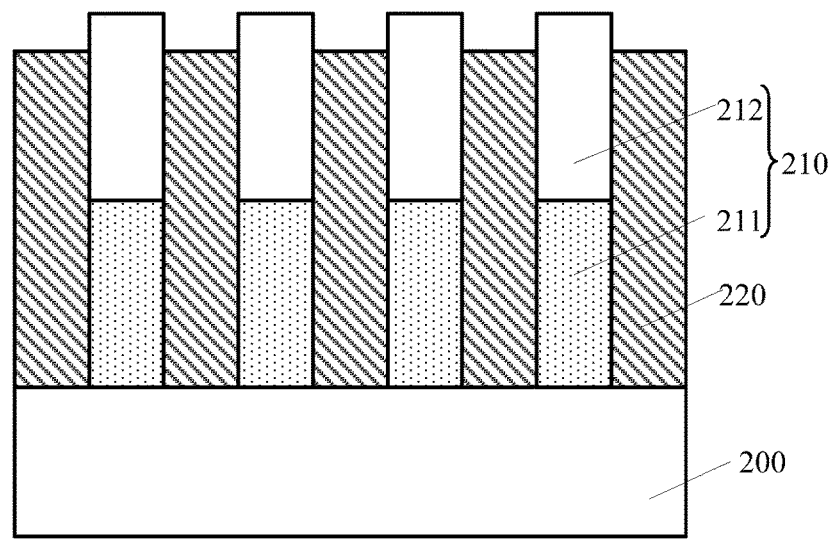

Returning to FIG. 8, after forming the plurality of initial gate structures, a capping layer may be formed (S103). FIG. 4 illustrates a corresponding semiconductor structure.

Referring to FIG. 4, a capping layer 220 may be formed on the base substrate 200 before etching the etching region of the initial control gate structure 212. The capping layer 220 may expose the etching region of the initial control gate structure 212. The height of the exposed initial control gate structure 212 may be in a range of approximately 300 Å-500 Å. The etching region of the initial control gate structure 212 may be etched by using the capping layer 220 as a mask to form the control gate structure from the initial control gate structure 212. The capping layer may be removed after etching the etching region of the initial control gate structure 212 by using the capping layer as a mask.

The capping layer 220 may be made of a photoresist material, an anti-reflective layer material, or an organic polymer, etc. A method for forming the capping layer 220 may include: forming an initial capping layer on the base substrate, where the initial capping layer may cover the plurality of initial gate structures; and back-etching the initial capping layer to form the capping layer. A process for forming the initial capping layer may include a spin coating process.

Figure 5:
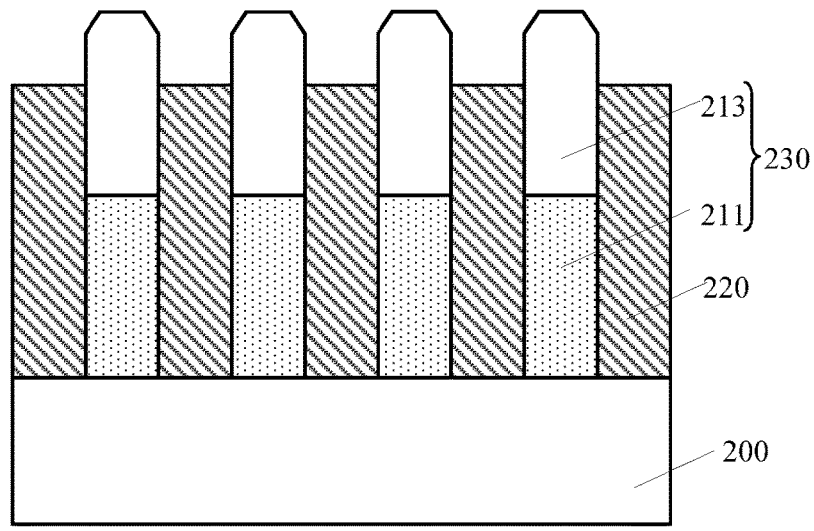

Returning to FIG. 8, after forming the capping layer, a first gate structure may be formed (S104). FIG. 5 illustrates a corresponding semiconductor structure.

Referring to FIG. 5, the etching region of the initial control gate structure 212 may be etched by using the capping layer 220 as a mask to form a control gate structure 213 from the initial control gate structure 212, and to form a first gate structure 230 from the initial gate structure 210.

The first gate structure 230 may include the floating gate structure 211 and the control gate structure 213 on the floating gate structure 211. The control gate structure 213 may include a body region and a top region above the body region.

The size of the top region of the control gate structure 213 may be smaller than the size of the body region of the control gate structure 213 along a direction perpendicular to a length direction of the control gate structure 213. In one embodiment, the top region of the control gate structure 213 may have a width less than the body region, and thus a top area of the top region (e.g., vertex region) is less than a cross-section area of the body region, along a direction parallel with a top surface of the base substrate 200.

The sidewall of the control gate structure 213 in the top region may be connected to the sidewall of the control gate structure 213 in the body region. In one embodiment, sidewalls of the top and body regions of the control gate structure 213 may be coplanar with each other, along a direction perpendicular to the top surface of the base substrate 200.

A process for etching the etching region of the initial control gate structure 212 by using the capping layer 220 as a mask may include a plasma etching process. A bias voltage may be provided in the plasma etching process.

Because the bias voltage is provided in the plasma etching process for etching the etching region of the initial control gate structure 212 by using the capping layer 220 as a mask, the etching gas may form a plasma under a source RF power. The plasma may move toward the sidewall of the exposed initial control gate structure 212 at an angle of inclination, and may undergo physical and chemical reactions with the sidewall of the exposed initial control gate structure 212. Because the distance between the adjacent initial control gate structures 212 is small, when the plasma moves toward the sidewall of the exposed initial control gate structure 212 at the angle of inclination, the adjacent initial control gate structure 212 may cause a blocking effect. As a result, along a direction perpendicular to the surface of the base substrate 200, the probability that the plasma is in contact with the sidewall of the exposed initial control gate structure 212 at the top may be greater than the probability that the plasma is in contact with the sidewall of the exposed initial control gate structure 212 at the bottom. Therefore, after performing the plasma etching process, the size of the top region of the control gate structure 213 may be smaller than the size of the body region of the control gate structure 213 along the direction perpendicular to the length direction of the control gate structure 213.

In one embodiment, parameters of the plasma etching process may include the following. Gases may include $CH_3F$, $O_2$ and He, $CH_3F$ flow rate may be in a range of approximately 100 sccm-500 sccm, $O_2$ flow rate may be in a range of approximately 30 sccm-100 sccm, He flow rate may be in a range of approximately 50 sccm-200 sccm, a source RF power may be in a range of approximately 100 watts-800 watts, a bias voltage may be in a range of approximately 20 volts-100 volts, and a chamber pressure may be in a range of approximately 1 mtorr-300 mtorr.

The control gate structure 213 may include a control gate dielectric layer (not illustrated) on the floating gate structure 211 and a control gate electrode layer (not illustrated) on the control gate dielectric layer.

When the initial control gate dielectric layer is a single-layer structure, the control gate dielectric layer may be a single-layer structure. Correspondingly, the control gate dielectric layer may be made of silicon oxide.

When the initial control gate dielectric layer is a stacked structure, the control gate dielectric layer may include a first control gate dielectric layer, a second control gate dielectric layer on the first control gate dielectric layer, and a third control gate dielectric layer on the second control gate dielectric layer. Correspondingly, the first control gate dielectric layer and the third control gate dielectric layer may be made of silicon oxide, and the second control gate dielectric layer may be made of silicon nitride. The control gate electrode layer may be made of polysilicon.

In one embodiment, the control gate structure 213 may include the control gate dielectric layer on the floating gate structure 211 and the control gate electrode layer on the control gate dielectric layer. In this case, the top region of the control gate structure 213 may include portions of the control gate electrode layer, and the body region of the control gate structure 213 may include portions of the control gate electrode layer and the control gate dielectric layer. The size of the top region of the control gate electrode layer may be smaller than the size of the body region of the control gate electrode layer along the direction perpendicular to the length direction of the control gate structure, and the sidewall of the control gate electrode layer in the top region may be connected to the sidewall of the control gate electrode layer in the body region.

In another embodiment, the control gate structure may include the control gate dielectric layer on the floating gate structure, the control gate electrode layer on the control gate dielectric layer, and a metal silicide layer on the control gate electrode layer. In this case, the control gate structure in the top region may include the metal silicide layer, and the control gate structure in the body region may include the control gate dielectric layer and at least portions of the control gate electrode layer. The size of the metal silicide layer in the top region may be smaller than the size of the control gate electrode layer in the body region along the direction perpendicular to the length direction of the control gate structure.

When the top region of the control gate structure includes the metal silicide layer and portions of the control gate electrode layer, and when the body region of the control gate structure includes the control gate dielectric layer and portions of the control gate electrode layer, the size of the metal silicide layer in the top region and the size of the control gate electrode layer in the top region may be smaller than the size of the control gate electrode layer in the body region, respectively, along the direction perpendicular to the length direction of the control gate structure, and the sidewall of the top region of the control gate electrode layer may be connected to the sidewall of the body region of the control gate electrode layer. When the top region of the control gate structure includes the metal silicide layer, and when the body region of the control gate structure includes the control gate dielectric layer and the control gate electrode layer, the size of the metal silicide layer in the top region may be smaller than the size of the control gate electrode layer in the body region along the direction perpendicular to the length direction of the control gate structure, and the sidewall of the metal silicide layer in the top region may be connected to the sidewall of the control gate electrode layer in the body region.

Returning to FIG. 8, after forming the first gate structure, the capping layer may be removed (S105). FIG. 6 illustrates a corresponding semiconductor structure.

Referring to FIG. 6, after etching the etching region of the initial control gate structure 212 by using the capping layer 220 as a mask, the capping layer 220 (illustrated in FIG. 5) may be removed. A process for removing the capping layer 220 may include a dry etching process, or a wet etching process, etc. In one embodiment, the process for removing the capping layer 220 may include a dry etching process.

Then, a first source region may be formed in the base substrate 200 on one side of the first gate structure 230, and a first drain region may be formed in the base substrate 200 on the other side of the gate structure 230.

In one embodiment, the first source region and the first drain region may be formed before subsequently forming the dielectric layer and after forming the first gate structure 230. In certain embodiments, the first source region and the first drain region may be formed after forming the initial gate structure 210 and before forming the first gate structure 230.

Returning to FIG. 8, after removing the capping layer, a dielectric layer and air gaps may be formed (S106). FIG. 7 illustrates a corresponding semiconductor structure.

Referring to FIG. 7, a dielectric layer 240 may be formed on the base substrate 200 to cover the plurality of first gate structures 230. At the same time, air gaps 241 may be formed in the dielectric layer 240 between the adjacent first gate structures 230. The top of each air gap 241 may be above or coplanar with the top surface of the control gate structure 213.

The dielectric layer 240 may be made of silicon oxide, silicon nitride, silicon oxynitride, silicon carboxynitride, or any other suitable low-K dielectric materials. A process for forming the dielectric layer 240 may include a chemical vapor deposition process. In the actual process, a chemical vapor deposition process having a weak filling capacity, such as a plasma enhanced chemical vapor deposition process, may be selected to form the dielectric layer 240.

Because the filling capacity of the process for forming the dielectric layer 240 is weak and the distance between the adjacent first gate structures 230 is small, the air gap 241 may be easily formed in the dielectric layer 240 between the adjacent first gate structures 230.

The size of the top region of the control gate structure 213 may be smaller than the size of the body region of the control gate structure 213 along the direction perpendicular to the length direction of the control gate structure 213, and the sidewall of the top region of the control gate structure 213 may be connected to the sidewall of the body region of the control gate structure 213. Thus, the growth rate of the dielectric layer 240 in the vertex region of the top region of the control gate structure may be larger than the growth rate of the dielectric layer 240 at other locations of the control gate structure 213 when forming the dielectric layer 240. The growth of the dielectric layer 240 in the vertex region of the top region of the control gate structure may determine the position of the top of the air gap 241.

When forming the dielectric layer 240, the growth of the dielectric layer 240 in the vertex region of the top region of the control gate structure 213 may be affected by the joint action of the growth of the dielectric layer 240 on the top surface and sidewall surface of the control gate structure 213. As a result, the growth rate of the dielectric layer 240 in the vertex region of the top region of the control gate structure may be larger than the growth rate of the dielectric layer 240 at other locations of the control gate structure when forming the dielectric layer 240.

The distance between the adjacent control gate structures 213 in the top region may be larger compared to the distance between the adjacent control gate structures 213 in the body region, the dielectric layer 240 may grow obliquely upward along the sidewall of the control gate structure 213 in the top region. As a result, the top of the air gap may be high, and the top of the air gap may be above or coplanar with the top surface of the control gate structure.

The air gap 241 having a top above or coplanar with the top surface of the control gate structure 213 may be used to reduce the probability of occurrence of programmed crosstalk between the adjacent first gate structures 230.

Because the top of the air gap 241 is above or coplanar with the top surface of the control gate structure 213, the average dielectric constant of the dielectric between the adjacent control gate structures 213 in the top region and between the adjacent control gate structures 213 in the body region may be small. Correspondingly, the capacitance between the adjacent first gate structures 230 may be reduced. The voltage applied to each first gate structure 230 may be coupled to the adjacent first gate structure 230 to a lesser extent, and each first gate structure 230 may have less influence on the voltage applied to the adjacent first gate structure 230. Therefore, the probability of occurrence of programmed crosstalk between the adjacent first gate structures 230 may be reduced.

When the control gate structure 213 includes the control gate dielectric layer on the floating gate structure 211 and the control gate electrode layer on the control gate dielectric layer, the top of the air gap 241 may be above or coplanar with the top surface of the control gate electrode layer.

When the control gate structure 213 includes the control gate dielectric layer on the floating gate structure 211, the control gate electrode layer on the control gate dielectric layer, and the metal silicide layer on the control gate electrode layer, the top of the air gap 241 may be above or coplanar with the top surface of the metal silicide layer.

The dielectric layer 240 may also cover the first source region and the first drain region. In one embodiment, the method for forming the memory may also include forming a first conductive plug and a second conductive plug in the dielectric layer 240. The first conductive plug may expose the top surface of the first gate structure 230, and the second conductive plug may expose the first source region or the first drain region.

Accordingly, a memory is also provided in the present disclosure. Referring to FIG. 7, the memory may include a base substrate 200 and a plurality of first gate structures 230 on the base substrate 200. Each first gate structure 230 may include a floating gate structure 211 and a control gate structure 213 on the floating gate structure 211. The control gate structure 213 may include a body region and a top region above the body region. The size of the top region of the control gate structure 213 may be smaller than the size of the body region of the control gate structure 213 along a direction perpendicular to a length direction of the control gate structure 213. In one embodiment, the top region of the control gate structure 213 may have a width less than the body region, and thus a top area of the top region (e.g., vertex region) is less than a cross-section area of the body region, along a direction parallel with a top surface of the base substrate 200. The sidewall of the top region of the control gate structure 213 may be connected to the sidewall of the body region of the control gate structure 213. In one embodiment, sidewalls of the top and body regions of the control gate structure 213 may be coplanar with each other, along a direction perpendicular to top surface of the base substrate 200. The memory may also include a dielectric layer 240 on the base substrate 200 and covering the plurality of first gate structures 230, and air gaps 241 in the dielectric layer 240 between the adjacent first gate structures 230. The top of each air gap 241 may be above or coplanar with the top surface of the control gate structure 213.

The dielectric layer 240 may be made of silicon oxide, silicon nitride, silicon oxynitride, silicon carboxynitride, or any other suitable low-K dielectric materials. The control gate structure 213 may include a control gate dielectric layer on the floating gate structure 211 and a control gate electrode layer on the control gate dielectric layer.

In one embodiment, the control gate structure 213 may include the control gate dielectric layer on the floating gate structure 211 and the control gate electrode layer on the control gate dielectric layer. In this case, the top region of the control gate structure 213 may include portions of the control gate electrode layer, and the body region of the control gate structure 213 may include portions of the control gate electrode layer and the control gate dielectric layer. The size of the control gate electrode layer in the top region may be smaller than the size of the control gate electrode layer in the body region along the direction perpendicular to the length direction of the control gate structure, and the sidewall of the control gate electrode layer in the top region may be connected to the sidewall of the control gate electrode layer in the body region.

In another embodiment, the control gate structure may include the control gate dielectric layer on the floating gate structure, the control gate electrode layer on the control gate dielectric layer, and a metal silicide layer on the control gate electrode layer. In this case, the top region of the control gate structure may include the metal silicide layer, and the body region of the control gate structure may include the control gate dielectric layer and at least portions of the control gate electrode layer. The size of the metal silicide layer in the top region may be smaller than the size of the control gate electrode layer in the body region along the direction perpendicular to the length direction of the control gate structure.

When the top region of the control gate structure includes the metal silicide layer and portions of the control gate electrode layer, and when the body region of the control gate structure includes the control gate dielectric layer and portions of the control gate electrode layer, the size of the metal silicide layer in the top region and the size of the control gate electrode layer in the top region may be smaller than the size of the control gate electrode layer in the body region, respectively, along the direction perpendicular to the length direction of the control gate structure, and the sidewall of the control gate electrode layer in the top region may be connected to the sidewall of the control gate electrode layer in the body region. When the top region of the control gate structure includes the metal silicide layer, and when the body region of the control gate structure includes the control gate dielectric layer and the control gate electrode layer, the size of the metal silicide layer in the top region may be smaller than the size of the control gate electrode layer in the body region along the direction perpendicular to the length direction of the control gate structure, and the sidewall of the metal silicide layer in the top region may be connected to the sidewall of the control gate electrode layer in the body region.

When the control gate structure 213 includes the control gate dielectric layer on the floating gate structure 211 and the control gate electrode layer on the control gate dielectric layer, the top of the air gap 241 may be above or coplanar with the top surface of the control gate electrode layer.

When the control gate structure 213 includes the control gate dielectric layer on the floating gate structure 211, the control gate electrode layer on the control gate dielectric layer, and the metal silicide layer on the control gate electrode layer, the top of the air gap 241 may be above or coplanar with the top surface of the metal silicide layer.

In the memory consistent with various disclosed embodiments, because the top of the air gap 241 is above or coplanar with the top surface of the control gate structure 213, the average dielectric constant of the dielectric between the adjacent control gate structures 213 in the top region and between the adjacent control gate structures 213 in the body region may be small. Correspondingly, the capacitance between the adjacent first gate structures 230 may be reduced. The voltage applied to each first gate structure 230 may be coupled to the adjacent first gate structure 230 to a lesser extent, and each first gate structure 230 may have less influence on the voltage applied to the adjacent first gate structure 230. Therefore, the probability of occurrence of programmed crosstalk between the adjacent first gate structures 230 may be reduced.

Another exemplary fabrication method for forming a memory is also provided in the present disclosure. The same or similar features of the disclosed embodiments and the above-described embodiments are not repeated herein. The difference may include that the base substrate may include a memory region and a logic region, and the first gate structure may be formed on the base substrate in the memory region. The method for forming the memory may also include forming a second gate structure on the base substrate in the logic region before forming the dielectric layer, where the dielectric layer may also cover the second gate structure. The second gate structure may include a second gate dielectric layer and a second gate electrode layer on the second gate dielectric layer.

In one embodiment, the method for forming the memory may also include: forming a second source region in the base substrate in the logic region on one side of the second gate structure; forming a second drain region in the base substrate in the logic region on the other side of the second gate structure; and forming the dielectric layer.

Correspondingly, another memory is also provided in the present disclosure. The same or similar features of the disclosed embodiments and the above-described embodiments are not repeated herein. The difference may include that the base substrate may include a memory region and a logic region, and the first gate structure may be formed on the base substrate in the memory region. The memory may also include a second gate structure on the base substrate in the logic region, where the dielectric layer may also cover the second gate structure.

The memory may also include a second source region in the base substrate in the logic region on one side of the second gate structure, and a second drain region in the base substrate in the logic region on the other side of the second gate structure. The dielectric layer may also cover the second source region and the second drain region.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A method for fabricating a memory, comprising:
  forming a plurality of first gate structures on a base substrate, wherein each first gate structure includes a floating gate structure and a control gate structure on the floating gate structure, the control gate structure includes a body region and a top region above the body region, a size of the top region of the control gate structure is smaller than a size of the body region of the control gate structure along a direction perpendicular to a length direction of the control gate structure, and a sidewall of the top region of the control gate structure is connected to a sidewall of the body region of the control gate structure; and forming a dielectric layer on the base substrate and covering the plurality of first gate structures, while simultaneously forming air gaps in the dielectric layer between the adjacent first gate structures, wherein a top of each air gap is above or coplanar with a bottom surface of the dielectric layer that coincides with a top surface of the control gate structure.

2. The method according to claim 1, wherein forming the plurality of first gate structures includes:

forming a plurality of initial gate structures on the base substrate, wherein each initial gate structure includes the floating gate structure and an initial control gate structure on the floating gate structure, and the initial control gate structure includes an etching region at a top; and etching the etching region of the initial control gate structure to form the control gate structure from the initial control gate structure and to form the first gate structure from the initial gate structure.

3. The method according to claim 2, before etching the etching region of the initial control gate structure, further including:

forming a capping layer on the base substrate, wherein the capping layer exposes the etching region of the initial control gate structure, and a height of the exposed initial control gate structure is in a range of approximately 300 Å-500 Å;

etching the etching region of the initial control gate structure by using the capping layer as a mask to form the control gate structure from the initial control gate structure; and removing the capping layer after etching the etching region of the initial control gate structure by using the capping layer as a mask.

4. The method according to claim 3, wherein:
etching the etching region of the initial control gate structure by using the capping layer as a mask includes a plasma etching process.

5. The method according to claim 4, wherein parameters of the plasma etching process include:
gases including $CH_3F$, $O_2$ and He;
a $CH_3F$ flow rate in a range of approximately 100 sccm-500 sccm;
an $O_2$ flow rate in a range of approximately 30 sccm-100 sccm;
a He flow rate in a range of approximately 50 sccm-200 sccm;
a source RF power in a range of approximately 100 watts-800 watts;
a bias voltage in a range of approximately 20 volts-100 volts; and
a chamber pressure in a range of approximately 1 mtorr-300 mtorr.

6. The method according to claim 3, wherein:
the capping layer is made of one of a photoresist material, an anti-reflective layer material, and an organic polymer.

7. The method according to claim 3, wherein forming the capping layer includes:

forming an initial capping layer on the base substrate, wherein the initial capping layer covers the plurality of initial gate structures; and
back-etching the initial capping layer to form the capping layer.

8. The method according to claim 1, wherein:
forming the dielectric layer includes a plasma enhanced chemical vapor deposition process.

9. The method according to claim 1, wherein:
the dielectric layer is made of one of silicon oxide, silicon nitride, silicon oxynitride, and silicon carboxynitride.

10. The method according to claim 1, wherein:
the control gate structure includes a control gate dielectric layer on the floating gate structure and a control gate electrode layer on the control gate dielectric layer.

11. The method according to claim 10, wherein:
the control gate structure includes the control gate dielectric layer and the control gate electrode layer;
the top region of the control gate structure includes portions of the control gate electrode layer, and the body region of the control gate structure includes the control gate dielectric layer and portions of the control gate electrode layer;
a size of the control gate electrode layer in the top region is smaller than a size of the control gate electrode layer in the body region along the direction perpendicular to the length direction of the control gate structure, and a sidewall of the control gate electrode layer in the top region is connected to a sidewall of the control gate electrode layer in the body region; and
the top of the air gap is above or coplanar with a top surface of the control gate electrode layer.

12. The method according to claim 10, wherein:
the control gate structure includes the control gate dielectric layer, the control gate electrode layer, and a metal silicide layer on the control gate electrode layer;
the top region of the control gate structure includes the metal silicide layer, and the body region of the control gate structure includes the control gate dielectric layer and at least portions of the control gate electrode layer;
a size of the metal silicide layer in the top region is smaller than a size of the control gate electrode layer in the body region along the direction perpendicular to the length direction of the control gate structure; and
the top of the air gap is above or coplanar with a top surface of the metal silicide layer.

13. The method according to claim 1, wherein:
the base substrate includes a memory region and a logic region;
the first gate structure is formed on the base substrate in the memory region;
a second gate structure is formed on the base substrate in the logic region before forming the dielectric layer; and
the dielectric layer covers the second gate structure.

14. A memory, comprising:
a plurality of first gate structures on a base substrate, wherein each first gate structure includes a floating gate structure and a control gate structure on the floating gate structure, the control gate structure includes a body region and a top region above the body region, a size of the top region of the control gate structure is smaller than a size of the body region of the control gate structure along a direction perpendicular to a length direction of the control gate structure, and a sidewall of the top region of the control gate structure is connected to a sidewall of the body region of the control gate structure; and a dielectric layer, on the base substrate and covering the plurality of first gate structures, wherein the dielectric layer contains air gaps between the adjacent first gate structures, and a top of each air gap is above or coplanar with a bottom surface of the dielectric layer that coincides with a top surface of the control gate structure.

15. The memory according to claim 14, wherein:
the dielectric layer is made of one of silicon oxide, silicon nitride, silicon oxynitride, and silicon carboxynitride.

16. The memory according to claim 14, wherein:
the control gate structure includes a control gate dielectric layer on the floating gate structure and a control gate electrode layer on the control gate dielectric layer.

17. The memory according to claim 16, wherein:
the control gate structure includes the control gate dielectric layer and the control gate electrode layer;
the top region of the control gate structure includes portions of the control gate electrode layer, and the body region of the control gate structure includes the control gate dielectric layer and portions of the control gate electrode layer;
a size of the control gate electrode layer in the top region is smaller than a size of the control gate electrode layer in the body region along the direction perpendicular to the length direction of the control gate structure, and a sidewall of the control gate electrode layer in the top region is connected to a sidewall of the control gate electrode layer in the body region; and
the top of the air gap is above or coplanar with a top surface of the control gate electrode layer.

18. The memory according to claim 16, wherein:
the control gate structure includes the control gate dielectric layer, the control gate electrode layer, and a metal silicide layer on the control gate electrode layer;
the top region of the control gate structure includes the metal silicide layer, and the body region of the control gate structure includes the control gate dielectric layer and at least portions of the control gate electrode layer;
a size of the metal silicide layer in the top region is smaller than a size of the control gate electrode layer in the body region along the direction perpendicular to the length direction of the control gate structure; and
the top of the air gap is above or coplanar with a top surface of the metal silicide layer.

19. The memory according to claim 18, wherein:
when the top region of the control gate structure includes the metal silicide layer and portions of the control gate electrode layer, and when the body region of the control gate structure includes the control gate dielectric layer and portions of the control gate electrode layer,
the size of the metal silicide layer in the top region and a size of the control gate electrode layer in the top region are smaller than the size of the control gate electrode layer in the body region, respectively, along the direction perpendicular to the length direction of the control gate structure, and a sidewall of the control gate electrode layer in the top region is connected to the sidewall of the control gate electrode layer in the body region; and
when the top region of the control gate structure includes the metal silicide layer, and when the body region of the control gate structure includes the control gate dielectric layer and the control gate electrode layer,
the size of the metal silicide layer in the top region is smaller than the size of the control gate electrode layer in the body region along the direction perpendicular to the length direction of the control gate structure, and the sidewall of the metal silicide layer in the top region is connected to the sidewall of the control gate electrode layer in the body region.

20. A memory, comprising:
a plurality of first gate structures on a base substrate, wherein each first gate structure includes a floating gate structure and a control gate structure on the floating gate structure, the control gate structure includes a body region and a top region above the body region, a size of the top region of the control gate structure is smaller than a size of the body region of the control gate structure along a direction perpendicular to a length direction of the control gate structure, and a sidewall of the top region of the control gate structure is connected to a sidewall of the body region of the control gate structure; and
a dielectric layer, on the base substrate and covering the plurality of first gate structures, wherein the dielectric layer contains air gaps between the adjacent first gate structures, and a top of each air gap is above or coplanar with a top surface of the control gate structure wherein:
the base substrate includes a memory region and a logic region;
the first gate structure is on the base substrate in the memory region; and
a second gate structure is on the base substrate in the logic region, wherein the dielectric layer covers the second gate structure.

* * * * *